United States Patent [19]

Akahori

[11] Patent Number: 5,508,066
[45] Date of Patent: Apr. 16, 1996

[54] METHOD FOR FORMING A THIN FILM

[75] Inventor: Takashi Akahori, Hyogo, Japan

[73] Assignee: Sumitomo Metal Industries, Ltd., Osaka, Japan

[21] Appl. No.: 305,732

[22] Filed: Sep. 14, 1994

Related U.S. Application Data

[63] Continuation of Ser. No. 957,081, Oct. 6, 1992, abandoned.

[30] Foreign Application Priority Data

Oct. 7, 1991 [JP] Japan .................................. 3-259163

[51] Int. Cl.$^6$ .................................................. H05H 1/02
[52] U.S. Cl. ........................... 427/571; 427/250; 427/253; 427/255.2; 427/255.5; 427/255.7; 427/294; 427/314; 427/374.1; 427/379; 427/383.1; 427/398.1; 427/404; 427/419.7; 427/573; 427/575; 427/576; 427/585; 427/595
[58] Field of Search .................... 427/534, 535, 427/547, 553, 571, 573, 576, 250, 253, 255.2, 255.5, 255.7, 294, 314, 374.1, 379, 383.1, 419.7, 398.1, 404, 575, 585, 595

[56] References Cited

PUBLICATIONS

Patent Abstracts of Japan, vol. 13, No. 549 (p. 103, C–662) Dec. 7, 1989, abstract.
Patent Abstracts of Japan, vol. 13, No. 394 (p. 145, C–631) Aug. 31, 1989, abstract.
European Search Report dated Jan. 7, 1993.

*Primary Examiner*—Bernard Pianalto
*Attorney, Agent, or Firm*—Armstrong, Westerman, Hattori, McLeland & Naughton

[57] ABSTRACT

In order to decompose $TiCl_4$ to Ti and Cl completely, extremely high energy of more than 400 kcal $mol^{-1}$ is required.

In the method according to the present invention, use of unequilibrium plasma under reduced pressure is noticed, and it is especially noticed that in the plasma generated by resonance phenomenon, there are high energy electrons, which collide and enhance decomposition and reduction. Therefore, it is possible to form a Ti film without such high substrate temperature as 2000° C., and more, to form a Tifilm with good step coverage even in a fine contact hole.

12 Claims, 12 Drawing Sheets

METHOD FOR FORMING A THIN FILM

This application is a continuation of application Ser. No. 07/957,081 filed Oct. 6, 1992, now abandoned.

BACKGROUND OF THE INVENTION

1. Field of the Invention

The present invention relates to a method for forming a thin film and systems for the same, and more particularly a method for forming a thin film for a barrier metal and systems for the same.

2. Description of the Relevant Art

A contact region in LSI has a diffusion layer on the surface of a substrate as a base, connected with an interconnection such as Al through a contact hole.

However, as shrinkage and high integration of LSI are proceeding, the diffusion layer is becoming shallower, which causes such problems as in said shallow diffusion layer, Al spike occurs and breaks junction, or Si precipitates on the bottom of a contact hole, leading to an increase in contact resistance.

In order to solve these problems, Al alloys (e.g. Al-1% Si)previously contaminated with about 0.5–2% of Si are used as electrode connection material. Recently, however, even these Al alloys are becoming insufficient to prevent precipitation of Si, as the diameter of a contact hole is getting smaller than before.

Accordingly, forming a thin film called a barrier metal between Al alloy and a Si substrate for preventing diffusion has been considered. A TiN film is noticed as a barrier metal on account of its low electrical resistance material and chemical stability (Yamanishi, Yoshihara, Kitahara and Hosokawa; "Vacuum", Japan, vol.30, No.5, p347, 1987).

It is desirable that material for a barrier metal should have small barrier height to both $p^+Si$ and $n^+Si$ fundamentally. As shown in Table 1 below, however, a TiN film has high contact resistance to a Si diffusion layer (especially high to $p^+Si$), so that forming a base film of such as Ti is required.

TABLE 1

Contact Resistance of Barrier Metal And Silcide

| barrier metal and silicide | $n^+$ Si ($\times 10^{-7}$ $\Omega\ cm^2$) | $N_D$ ($cm^3$) | $p^+$ Si ($\times 10^{-7}$ $\Omega\ cm^2$) | $N_D$ ($cm^{-3}$) | Ref. |
|---|---|---|---|---|---|
| W(CVD) | 2.2 | 1E20 | | 7E19 | |
| TiW | 2.0 | 1E20 | 4.5 | 7E19 | |
| TiW/PtSi | 1.2 | 1E20 | 3.6 | 7E19 | |
| TiN | 1.8–2.7 | | 44–8.9 | | 21 |
| TiN/Ti | 0.4–0.5 | | 7.0–8.9 | | 21 |
| TiSi$_2$ | 0.8 | 2.3E20 | 700 | 1E19 | 22 |
| NiSi | 0.5 | 2.3E20 | 200 | 1E19 | 22 |
| Pd$_2$Si | 0.7 | 2.3E20 | 30 | 1E19 | 22 |

(Saito; "Semicon Seminar", Japan, June, 1987, p181)

A Ti film is usually formed by sputter method with a Ti target. Few examples of forming a Ti film by CVD methods (thermal CVD method, plasma CVD method) have been reported.

Besides, the formation of Ti by using plasma has been reported (Narutomi; "Titanium Zirconium", vol.24, No.3, July, 1976, pp.130–144). This comprises reducing a halogenide product of Ti (TiCl$_4$) to titanium with a reductant such as hydrogen by using an arc plasma jet, wherein supply of material into a plasma jet torch of 2000° C. is required. In addition, it says that in the case of using argon hydrogen plasma for reduction of TiC$_4$ (Krapukhin & Korolev, 1968), fine powder of titanium may be obtained, which no one has even tried.

As described above, a TiN film is an effective material for a barrier metal of LSI. However, a TiN film has high contact resistance to a Si diffusion layer, so that forming a base film of such as Ti is required.

Although a Ti film is usually formed by sputter method as mentioned above, forming a Ti film by sputter method has poor step coverage. Therefore, as shrinkage of a contact hole proceeds, leading to higher aspect ratio, little Ti deposits on the bottom of the contact hole, as a result, this method cannot be applied to LSI which is getting finer.

Since deposition by LPCVD (low pressure chemical vapor deposition) method generally has good step coverage, the deposition of a TiN film by LPCVD method has been studied. On the contrary, since deposition of a Ti film needs high energy for reduction of TiC$_4$, it is impossible to form a Ti film by LPCVD method in which reaction is caused by only thermal energy.

And since forming Ti by an arc plasma jet is high temperature treatment over 2000° C., it is impossible to include such high temperature treatment in the process of producing LSI, by which only powder of Ti has been ever obtained.

SUMMARY OF THE INVENTION

The present invention was developed in consideration of the above mentioned problems, which makes it possible to form a Ti or Ti rich TiN film at such low temperature as applicable to the process of producing LSI, produces a contact having both low contact resistance and a good barrier characteristic, due to the combination with the deposition process of a TiN film, and enables formation of a stable contact having low contact resistance to be carried out in good yield and repeatability, due to including the processes of pretreatment and thermal treatment.

BRIEF DESCRIPTION OF THE DRAWINGS

FIG. 7 comprises graphs showing the results of SIMS analysis of the interface of Ti-Si in the direction of depth:(a) with pretreatment and (b) without pretreatment.

FIG. 8 comprises charts showing the results of SIMS analysis of the interface of Ti-Si in the direction of depth: (a)with pretreatment and (b) without pretreatment.

DETAILED DESCRIPTION OF THE INVENTION

In more detail, the method for forming a thin film and systems for the same according to the present invention have characteristics as follows;

(1) in a method of forming a thin film according to the present invention, by the plasma CVD method wherein $TiCl_4$ and $H_2$, or $TiCl_4$, $H_2$ and Ar gases are used, a Ti film is formed on a substrate;

(2) by the plasma CVD method wherein $TiCl_4$, $H_2$ and $N_2$, or $TiCl_4$, $H_2$, $N_2$, and Ar gases are used at less than 0.5 of $N_2$ flow rate to $TiCl_4$, a Ti rich TiN film ($Ti_xN_y$, x>y) is formed on a substrate;

(3) in the method of forming a thin film according to (1) or (2), at the substrate temperature of less than 500° C., a Ti or Ti rich TiN film is formed;

(4) by the method according to (1), a Ti film is formed, and then by the magnetic enhanced plasma CVD method wherein $TiCl_4$, $H_2$ and $N_2$, or $TiCl_4$, $H_2$, $N_2$, and Ar gases are used at more than 0.5 of $N_2$ flow rate to $TiCl_4$, a TiN film is formed on the substrate;

(5) by the method according to (2), a Ti rich TiN film is formed, and then by the magnetic enhanced plasma CVD method wherein $TiCl_4$, $H_2$ and $N_2$, or $TiCl_4$, $H_2$, $N_2$, and Ar gases are used at more than 0.5 of $N_2$ flow rate to $TiCl_4$, a TiN film is formed on the substrate;

(6) by the method according to (3), a Ti or Ti rich TiN film is formed, and then by the magnetic enhanced plasma CVD method wherein $TiCl_4$, $H_2$ and $N_2$, or $TiCl_4$, $H_2$, $N_2$, and Ar gases are used at more than 0.5 of $N_2$ flow rate to $TiCl_4$, a TiN film is formed on the substrate;

(7) in the method of forming a thin film according to (4), the steps of forming a Ti film and a TiN film are carried out in the continuous plasma by changing gas sorts and/or the gas flow rate, so as to form a double layer film on the substrate successively;

(8) in the method of forming a thin film according to (5), the steps of forming a Ti rich TiN film and a TiN film are carried out in the continuous plasma by changing gas sorts and/or the gas flow rate, so as to form a double layer film on the substrate successively;

(9) in the method of forming a thin film according to (6), the steps of forming a Ti or Ti rich TiN film and a TiN film are carried out in the continuous plasma by changing gas sorts and/or the gas flow rate, so as to form a double layer film on the substrate successively;

(10) in the method of forming a thin film according to (4), a Ti film is formed on a substrate in a chamber, and then said substrate is conveyed in a vacuum to another chamber, where a TiN film is formed on said substrate;

(11) in the method of forming a thin film according to (5), a Ti rich TiN film is formed on a substrate in a chamber, and then said substrate is conveyed in a vacuum to another chamber, where a TiN film in formed on said substrate;

(12) in the method of forming a thin film according to (6), a Ti or Ti rich TiN film is formed on a substrate in a chamber, and then said substrate is conveyed in a vacuum to another chamber, where a TiN film is formed on said substrate;

(13) by the method according to (3), a Ti or Ti rich TiN film is formed on a substrate, and then thermal treatment of more than 500° C. is applied to said substrate;

(14) in the method of forming a thin film according to (10) or (11), a Ti or Ti rich TiN film is formed at the substrate temperature of less than 500° C., and then in the middle of transition in vacuum of said substrate to another chamber, thermal treatment of more than 500° C. is applied to said substrate;

(15) by the method according to (4), (5), (7), (8), (10) or (11), a Ti or Ti rich TiN film and a TiN film are formed at temperature of less than 500° C., and then said substrate is conveyed in a vacuum to an anneal chamber, where thermal treatment of more than 500° C. is applied to said substrate;

(16) a system used for the method of forming a thin film according to (10) or (11), has a chamber for forming a Ti or Ti rich TiN film on a substrate, another chamber for forming a TiN film additionally on said substrate, and a vacuum transition path for conveying said substrate in a vacuum between said chambers;

(17) in the method of forming a thin film according to (1) to (15), plasma cleaning is carried out before a Ti or Ti rich TiN film is formed;

(18) in the method of forming a thin film according to (17), plasma cleaning is carried out in a chamber where a Ti or Ti rich TiN film is formed;

(19) a system used for the method of forming a thin film according to (17), has a chamber for plasma cleaning, another chamber for forming a Ti or Ti rich TiN film, and a vacuum transition path for conveying a substrate in a vacuum between said chambers;

(20) in the method of forming a thin film according to (1) to (15), a substrate is irradiated with $H_2$ plasma, or $H_2$ and Ar plasma before one of a Ti film, a Ti rich TiN film and a TiN film is formed; and (21) in the method of forming a thin film according to (20), irradiating a substrate with $H_2$ plasma, or $H_2$ and Ar plasma, and forming one of a Ti film, a Ti rich TiN film and a TiN film are carried out in the continuous plasma by changing gas sorts and/or the gas flow rate.

Figure 1:
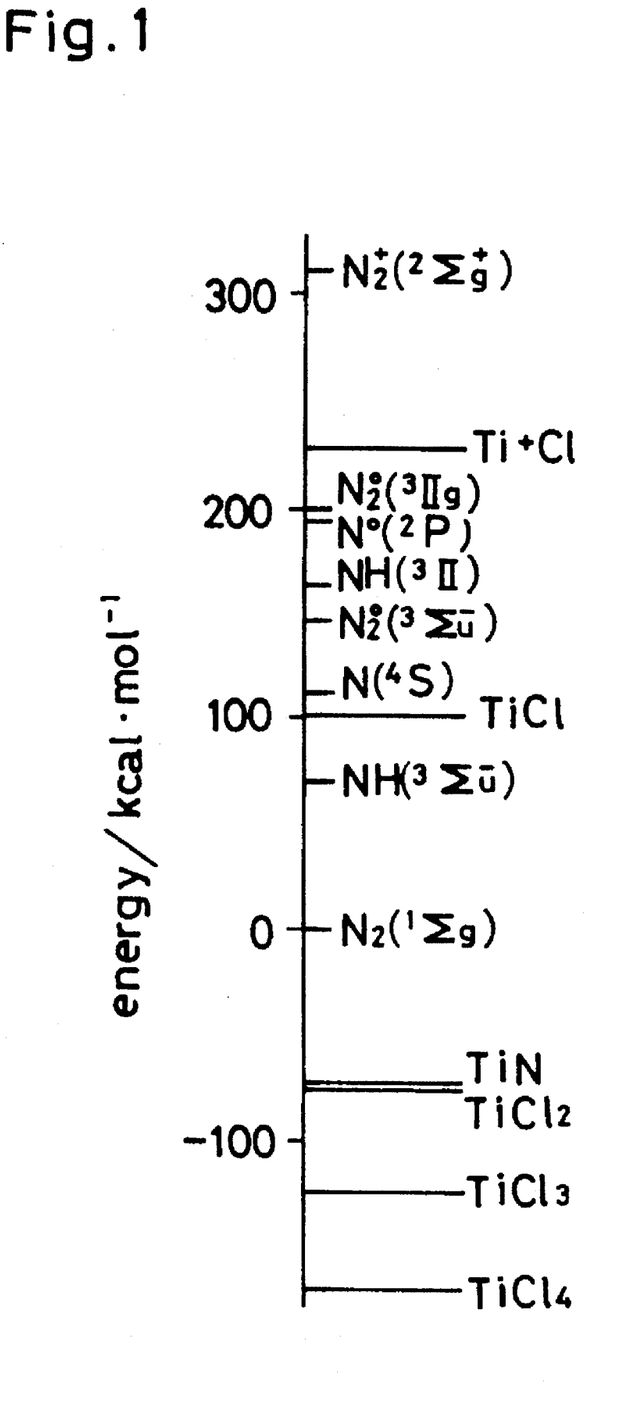
FIG. 1 is a view of the state of energy level in TiCl$_4$ -N$_2$ group.

As the mechanism of reaction of forming a Ti film, the following formula is considered.

$$TiCl_4 + 2H_2 \rightarrow Ti + 4HCl$$

But in order to decompose $TiCl_4$ to Ti and Cl completely, extremely high energy of more than 400 kcal $mol^{-1}$ is required as found in FIG. 1.

Accordingly, to cause said reduction, extremely high energy is required. The method using an arc plasma jet mentioned in the prior art, made this possible by treatment in the thermal plasma of more than 2000° C.

On the other hand, in the method according to the present invention, use of unequilibrium plasma (different in electron temperature, ion temperature, gas temperature etc.) under reduced pressure is noticed, and it is especially noticed that high energy electrons are produced in the plasma generated by resonance phenomenon such as magnetic enhanced plasma, especially ECR plasma. That is, in plasma under reduced pressure, especially in the plasma generated by resonance phenomenon, there are high energy electrons, which collide and enhance decomposition and reduction.

Therefore, without such high substrate temperature as 2000° C., a Ti film is formed, and that not in powder but in film shape.

Particularly the deposition with ECR plasma has an advantage of having good step coverage even to a fine contact hole, since ECR plasma has good directivity. Also, in the method according to the present invention, when a TiN film and a Ti rich TiN film ($Ti_xN_y$, x>y) are formed with $TiCl_4$, $H_2$, $N_2$ and Ar gases, a TiN film can be formed at more than 0.5 of $N_2$ flow rate to $TiCl_4$, and a Ti rich TiN film can be formed at less than 0.5. In addition, that makes it possible to form a Ti or Ti rich TiN film and a TiN film in succession by changing gas sorts and/or the gas flow rate.

Also, in the method according to the present invention, a Ti or Ti rich TiN film and a TiN film are formed in separate chambers. As a result, in contrast to the case where the deposition of a Ti or Ti rich TiN film and that of a TiN film are repeated in one chamber, it can be prevented that a Ti or Ti rich TiN film and TiN film are deposited in turn on the inside wall of the chamber and come off, leading to occurrence of particles.

When a Ti or Ti rich TiN film is formed on a silicon substrate at the substrate temperature of more than 500° C., the interface region between a Ti or Ti rich TiN film and silicon becomes silicide. The silicidation coincides with the deposition, but since the distribution of the substrate temperature while generating plasma is slightly uneven because of influence of plasma irradiation, the silicidation proceeds unevenly.

Therefore, in the method according to the present invention, when a Ti or Ti rich TiN film is formed on a silicon substrate and thermal treatment is applied thereto for making contact resistance lower (at the interface to silicon, $TiSi_2$ is formed), the deposition is carried out at the substrate temperature of less than 500° C., and then in the situation of no plasma and even distribution of temperature, thermal treatment of more than 500° C. is carried out, resulting in promoting silicidation with uniformity so as to form a stable contact having low resistance. The thermal treatment can be carried out either before or after the deposition of a TiN film.

When the method according to the present invention is put into practice, on the way to the deposition of a TiN film after the deposition of a Ti or Ti rich TiN film, it is not desirable for the substrate to be exposed to the air. Because it is easily oxidized in the air as Ti is an active metal.

In the method according to the present invention, by cleaning the surface of the substrate before the deposition of a Ti or Ti rich TiN film (mainly removing a native oxide film on the substrate), namely, by plasma cleaning with a gas such as $CF_4$, it is possible to clean the inside of a fine contact hole, which was a problem of the conventional wet scrubation.

In the case of the deposition with $TiCl_4$ gas, since $TiCl_4$ gas has low vapor pressure and high adsorptive characteristic, $TiCl_4$ gas is adsorbed on the surface of the substrate, resulting in forming a layer containing much chlorine at the interface region, after that, even by generating plasma and bombarding the surface of the substrate to activate it, said layer containing chlorine adsorbed to the surface cannot be easily caused to come off. On this point, in the method according to the present invention, by irradiating the substrate with $H_2$ plasma or $H_2$, Ar plasma to activate the surface of the substrate in advance of introducing $TiCl_4$ gas, $TiCl_4$ gas can be prevented from adsorbed to the surface of the substrate so as to prevent a chlorine adsorption layer from occurring.

Addition of Ar gas in the method according to the present invention, has effects of strengthening and stabilizing the strength of plasma, resulting in increasing the deposition rate etc.

DESCRIPTION OF PREFERRED EMBODIMENTS

Examples of a method for forming a thin film and systems devices for the same according to the present invention are described below, based on the drawings.

In this example, the case of forming a Ti or Ti rich thin film on a substrate by plasma CVD method is described.

Figure 2:
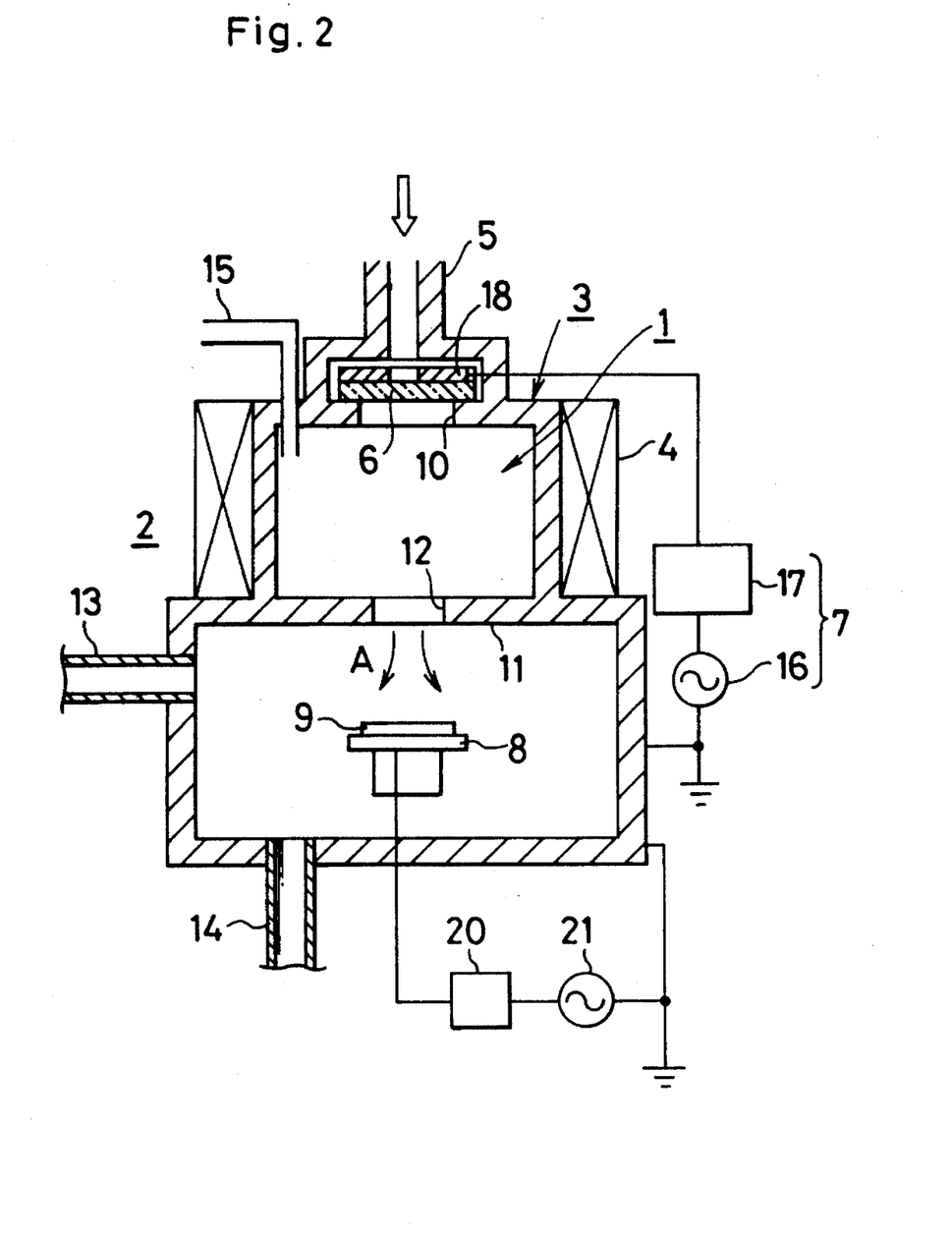
FIG. 2 is a diagrammatic sectional view showing an example of plasma CVD apparatus.

FIG. 2 is a diagrammatic sectional view showing a plasma CVD apparatus used for the method of forming a thin film according to this example.

Said plasma CVD apparatus comprises a main body 3 comprising a plasma generation chamber 1 and a reaction chamber 2, an exciting coil 4 arranged around the plasma generation chamber 1 and connected with a direct current power source (not shown), a wave guide 5 introducing a microwave generated from a microwave generator (not shown) into the plasma generation chamber 1, and so on. Reference numeral 6 designates a microwave inlet window comprising a quartz glass etc., reference numeral 7 designates a high frequency generator for applying a radio frequency (RF) power to said microwave inlet window, and reference numeral 8 designates a sample stage on which a substrate 9 is placed.

The plasma generation chamber 1, formed in mostly cylindrical shape with the first opening 10 for introducing a microwave formed almost at the center of the upper wall thereof, and the reaction chamber 2, below the plasma generation chamber 1, having a larger diameter than the plasma generation chamber 1, are formed in one body. The reaction chamber 2 and the plasma generation chamber 1 are divided by a diaphragm 11 with the second opening (plasma extraction window) 12 formed almost at the center thereof.

Also, at the side wall of the reaction chamber 2, the first guide pipe 13 is connected, and at the bottom of the reaction chamber 2, and exhaust pipe 14 communicating to exhaust system (not shown) is connected. And at the upper wall of the plasma generation chamber 1, the second guide pipe 15 is connected.

The high frequency generator 7 comprises a high frequency oscillator 16 and a matching box 17, and through a flat electrode 18 inserted between the microwave inlet window 6 and the wave guide 5, a radio frequency is applied to the microwave inlet window 6.

The sample stage 8 is connected with a radio frequency oscillator 21 for applying a radio frequency to the substrate 9 through a matching box 20. Applying the prescribed radio frequency to the substrate 9 by the radio frequency oscillator 21, and carrying out the above-mentioned method for forming a thin film, make it possible to form a thin film having good step coverage even in the case that the surface of the substrate is more fine patterned because of electrode bias on the substrate 9.

Also, heating the substrate 9 by a fixed heater and the like and keeping the temperature of the substrate 9 at the prescribed degree of less than 500° C., result in forming a thin film without silicidation reaction with the substrate.

Said plasma CVD apparatus is made up in such a manner as the definite magnetic field is produced in the plasma chamber 1 when the exciting coil 4 is supplied with direct current. As a result, such a magnetic field as angular frequency of a microwave ω introduced from the microwave oscillator into the plasma generation chamber 1 and angular frequency of electron cyclotron $\omega_c$ are equal in the plasma generation chamber 1, is formed, which can be also formed so as to make electrons do resonance phenomenon. The condition under which said resonance is produced, namely, ECR condition is easily determined by solving the following classical dynamic formula.

$$\omega = \omega_c = eB/m \qquad (1)$$

Here, e represents charge of electron (=1.6×10$^{19}$c), B represents magnetic flux density (T), and m represents mass of electrons (=9.1×10$^{-31}$ kg) respectively.

In this example as angular frequency of a microwave $\omega$ chosen was 2.45 GHz, by said formula (1) magnetic flux density B to satisfy the ECR condition was 8.75×10$^{-2}$ Torr.

In order to form a thin film by using said apparatus, firstly by operating the exhaust system, the pressure in the main body 3 was reduced to less than 1×10$^{-5}$ Torr, after that, while TiCl$_4$ was supplied at a flow rate of 10 sccm through the first guide pipe 13 into the reaction chamber 2, Ar at a flow rate of 43 sccm and H$_2$ at a flow rate of 50 sccm were supplied through the second pipe guide 15 into the plasma generation chamber 1. Then, the pressure in the main body 3 was set at the prescribed pressure such as 2×10$^{-3}$ Torr.

And turning on electricity in the radio frequency generator 7 and applying voltage to the microwave inlet window 6, made sputter effect of Ar ion by radio frequency, resulting in preventing a thin film of Ti from depositing on the microwave inlet window 6.

On the other hand, introducing a microwave of 2.8 kw from the microwave oscillator through the wave guide 5 into the plasma generation chamber 1, while connecting the exciting coil 4 with the direct current source, resulted in forming a magnetic field in the plasma generation chamber 1. Then making high energy electrons collide with a material gas, which was decomposed to be ionized, resulted in generating plasma.

Figure 3:
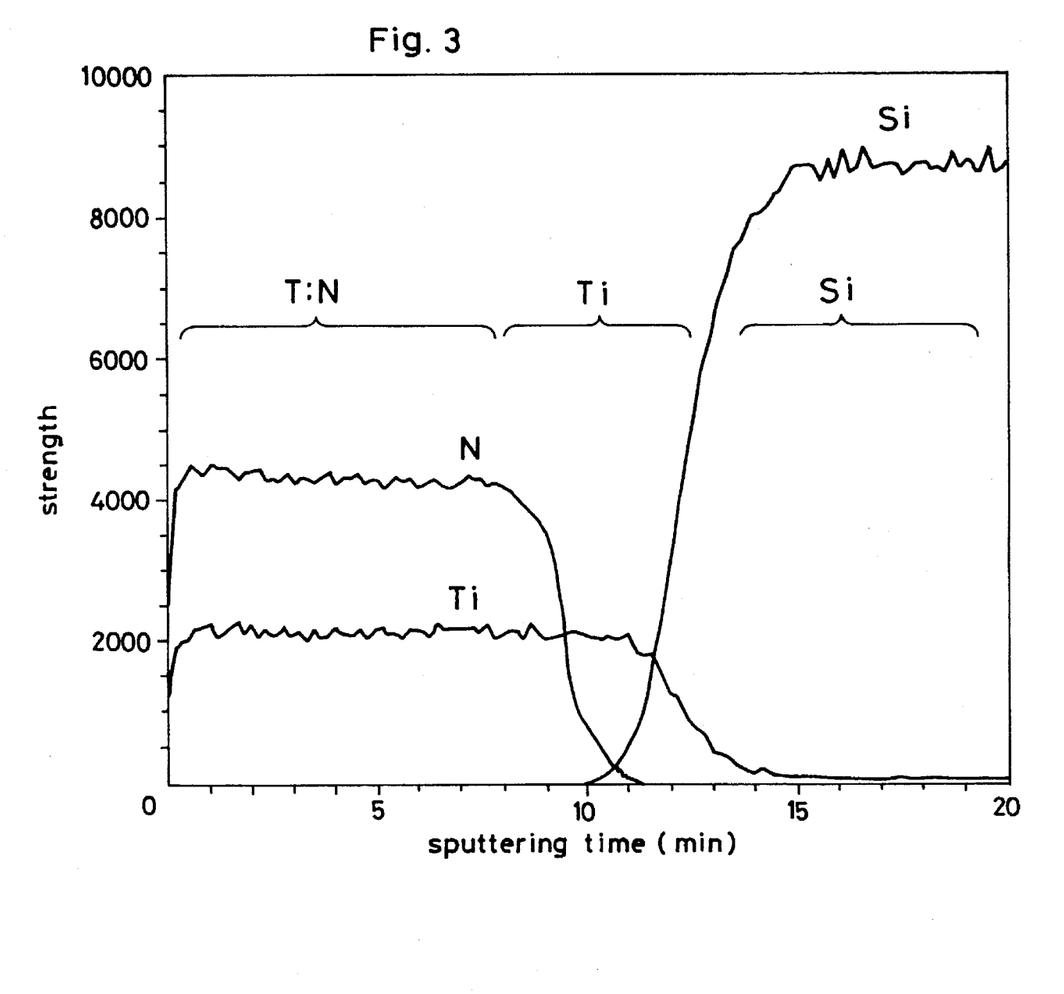
FIG. 3 is a graph showing the result of analysis in the direction of depth by Auger electron spectroscopy.

Next, the plasma passed through the second opening 12, was introduced into the reaction chamber 2 with acceleration in the direction of an arrow A in FIG. 2 by the divergent magnetic field, and a Ti or Ti rich thin film was formed on the substrate 9 placed on the sample stage 8. Then, adding N$_2$ gas at a flow rate of 15 sccm through the guide pipe 15 to form films in succession, resulted in forming a double layer film of TiN (1000Å)/Ti (300Å) on the Si substrate, as shown in FIG. 3. FIG. 3 shows the result of analysis by Auger electron spectroscopy, that is, the relationship between the sputtering time from the surface and the strength of each element, which indicates a Ti film was formed on the substrate and a TiN film was formed thereon. In this example, it is also noticed that the silicidation of the Ti film layer was inhibited as the film was formed at 460° C.

Besides, at various substrate temperatures, films were formed on a Si substrate and a quartz glass substrate and the film thickness of them were measured by SEM (scanning electron microscope). The relationship between the film thickness and the deposition rate (Å/min) is shown in FIG. 4.

Figure 4:
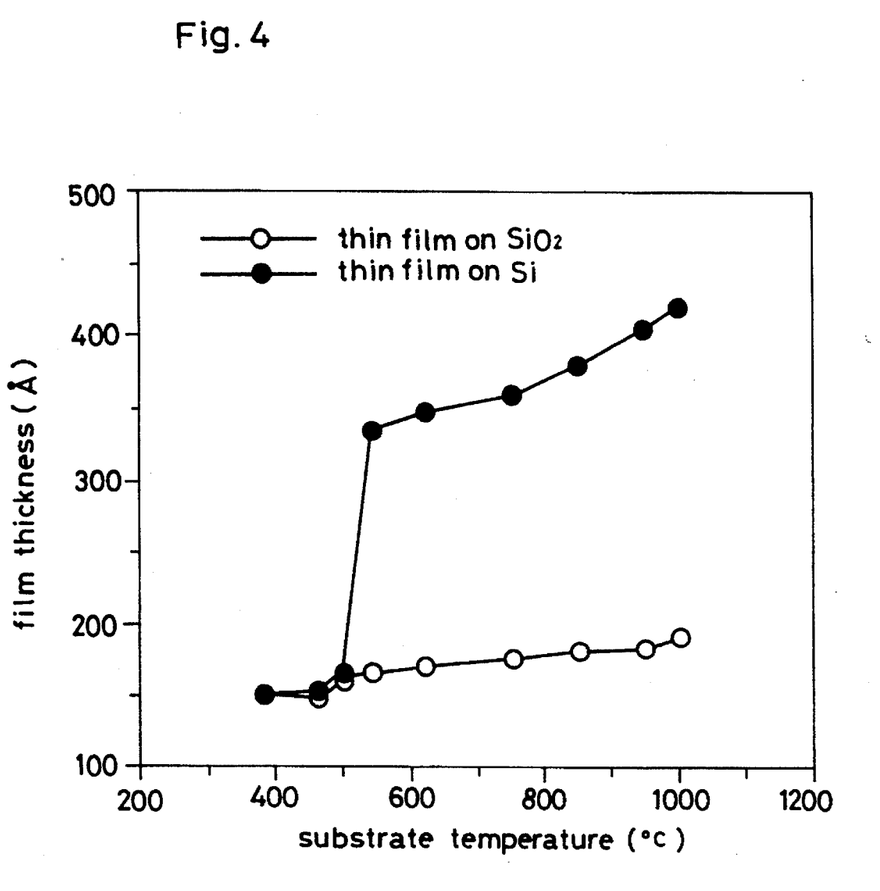
FIG. 4 is a graph indicating the dependence of the deposition amount of Ti rich films on a SiO$_2$ substrate and a Si substrate on the substrate temperature.

FIG. 4 indicates at the substrate temperature of more than 500° C., the thickness of the film deposited on the Si substrate is remarkably thicker than that on the quartz glass substrate. That means the deposited Ti film reacted with the Si substrate, resulting in forming a Ti silicide film having a large lattice constant. That is, the thickness of the deposited film looked thicker than it was.

As a result, it is noticed that at the substrate temperature of more than 500° C., a formed Ti or Ti rich film reacts with a Si substrate, leading to silicidation.

A LSI device practically produced proved that it is possible to make a Ti film silicide with no bad effects on the device, especially the diffusion layer, leading to a law resistance contact, if the deposition temperature is less than 1000° C.

Figure 5:
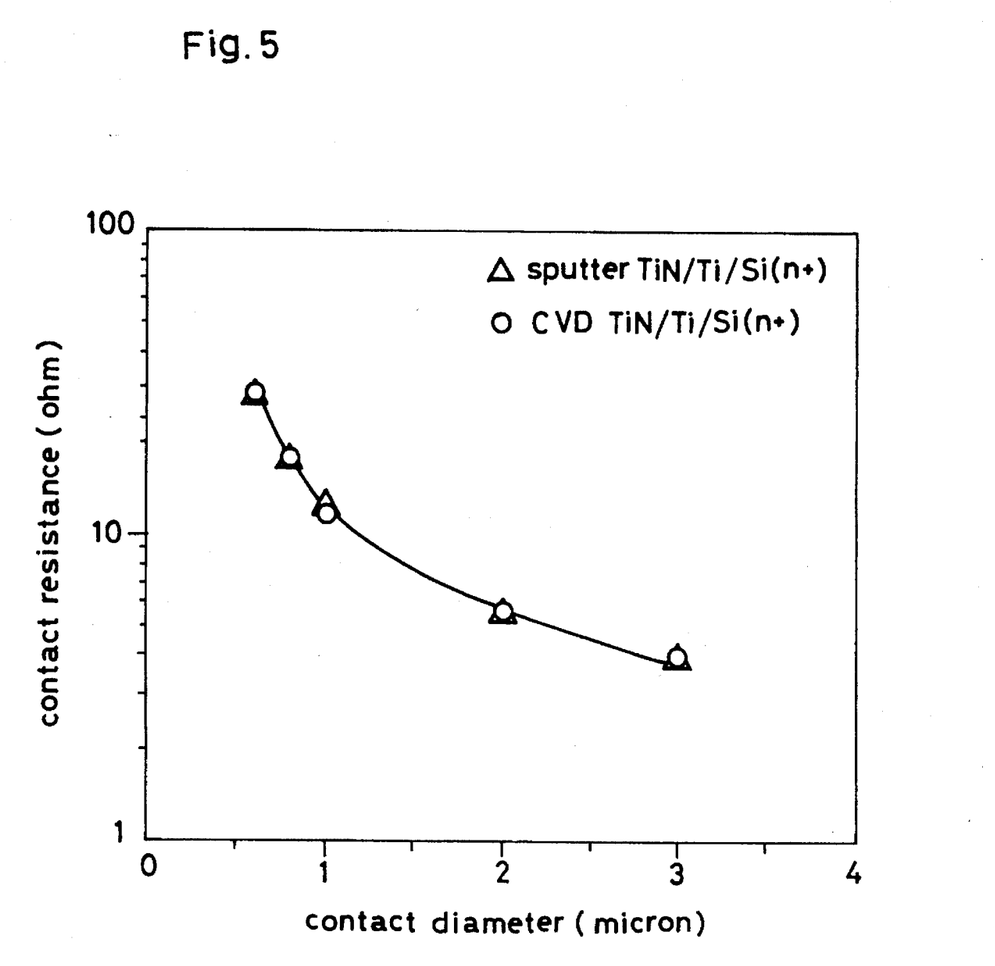
FIG. 5 is a graph indicating the relationship between contact hole diameter and contact resistance.

In addition, at the deposition temperature of 460° C., Ti films were formed in the contact hole regions having various diameters and then RTP(rapid thermal process) treatment for silicidation was applied to them under the optimized conditions as described below in Table 2.

The values of contact resistance were examined, shown in FIG. 5. For contrast, a Ti film and a TiN film were formed in the contact hole regions by sputter method, and then the RTP treatment for silicidation was applied as well. The values of contact resistance are also shown in FIG. 5. And the diffusion layer of the Si substrate used here was n channel.

As obvious from FIG. 5, by the ECR plasma CVD method a low resistance contact just like that by sputter method was achieved.

Figure 6:
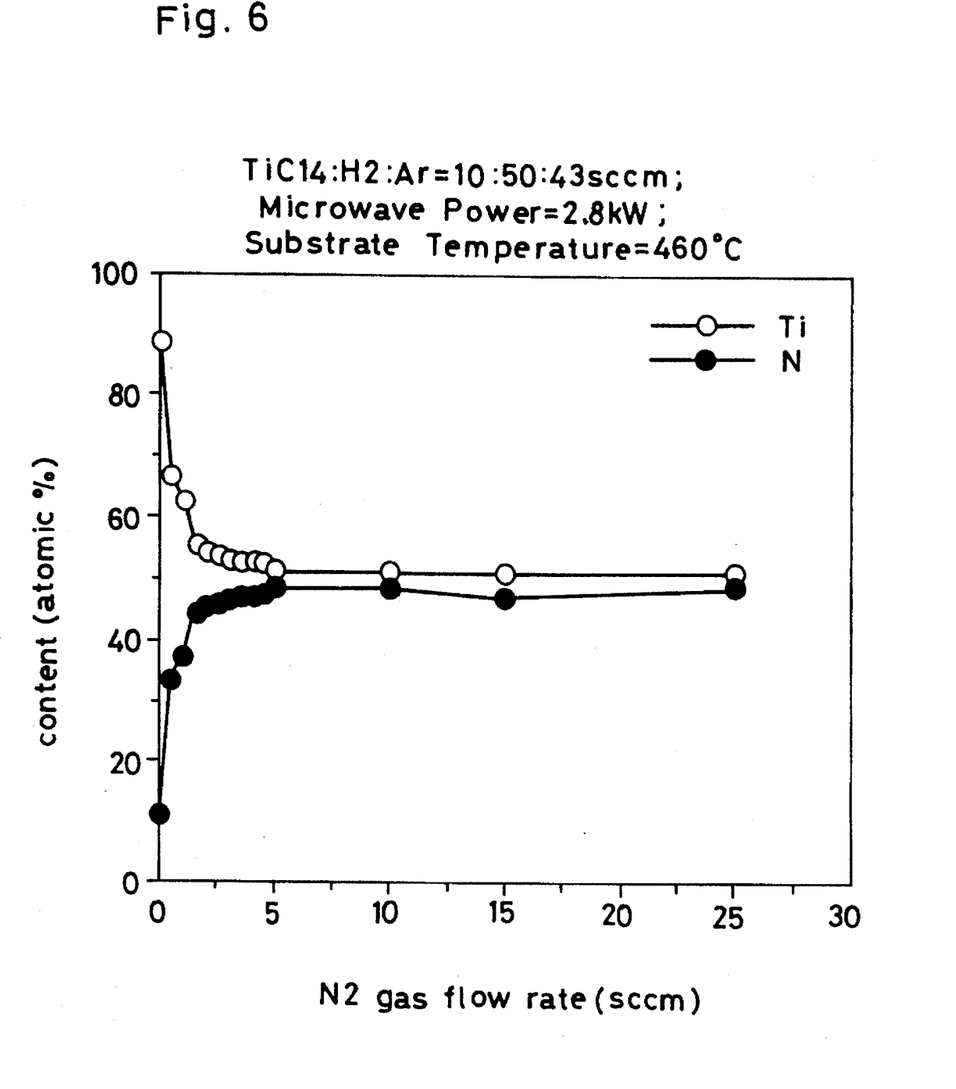
FIG. 6 is a graph indicating the film compositions for various N$_2$ gas flow rates.

Adding N$_2$ when a Ti film formed, enabled a TiN film to be formed, as shown in FIG. 6. As N$_2$ flow rate is gradually increased from 0, a Ti or Ti rich TiN film approaches a TiN film. When TiCl$_4$ flow rate is 10 sccm and N$_2$ flow rate is more than 5 sccm, the composition of TiN is almost 1:1, making no change. As a result, it is noticed that by increasing N$_2$ flow rate to TiCl$_4$ in the range of less than 0.5, a Ti film and a Ti rich TiN film can be formed successively.

The Ti rich TiN film (a film having higher proportion of Ti than the stoichiometric composition of Ti:N=1:1) formed by above-described method, has effects similar to a Ti film and can be substitutable enough for a Ti film as a barrier layer.

Since Ti is an active metal and easily oxidized in the air, in order to form a stable contact, it is necessary to form a TiN film continuously in the same chamber as a Ti film is formed, or to convey a formed Ti film in a vacuum to a TiN film formation chamber, where a TiN film is formed. When a TiN film was formed without exposure to the air after a Ti or Ti rich TiN film formed, the surface of the Ti film was not oxidized, resulting in forming a stable contact.

Figure 11:
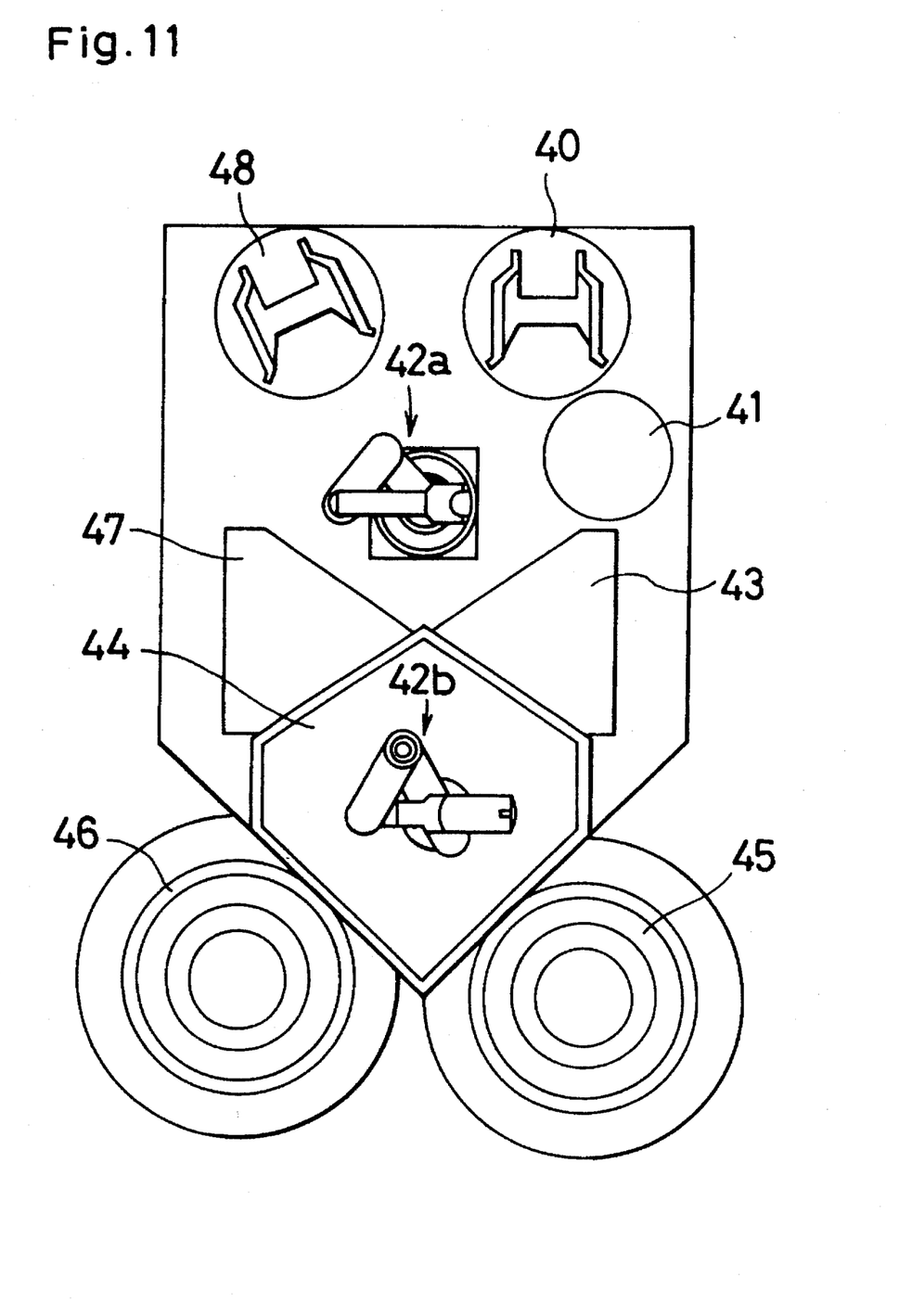
FIG. 11 is a ground plan showing a system in which a Ti film and a TiN film are formed in separate plasma CVD chambers.

A composition (a ground plan) of a system for forming a Ti film and a TiN film in separate chambers is shown in FIG. 11. A cassette stage 40 is a stage on which Si substrate before treatment are placed. The Si substrate set on the cassette stage 40 is transferred to an adjusting orientation flat 41 by a carrier robot 42a and orientation flat is adjusted. After that, again by the robot 42a said substrate is conveyed to a loading chamber 43. After vacuum exhaust of the loading chamber 43, said substrate is transferred by the robot 42b through a transfer chamber 44 to a plasma CVD chamber for forming a Ti film 45, where a Ti film is formed thereon.

Then, again through the transfer chamber 44, said substrate is transferred to a plasma CVD for forming a TiN film 46, where a TiN film is formed thereon.

All of the transfer chamber 44, the plasma CVD chamber 45 and the plasma CVD chamber 46 can be evacuated to vacuum. Therefore, until a TiN film is formed in the plasma CVD chamber 46 after a Ti film formed in the plasma CVD chamber 45, the Si substrate has no chance to be exposed to the air. After a TiN film formed in the plasma CVD chamber 46, said substrate is transferred through the transfer chamber 44 to a loading chamber 47, where said substrate comes back into the air. It is the end of this process when said substrate is carried to the cassette stage 48 by the robot 42.

Figure 9:
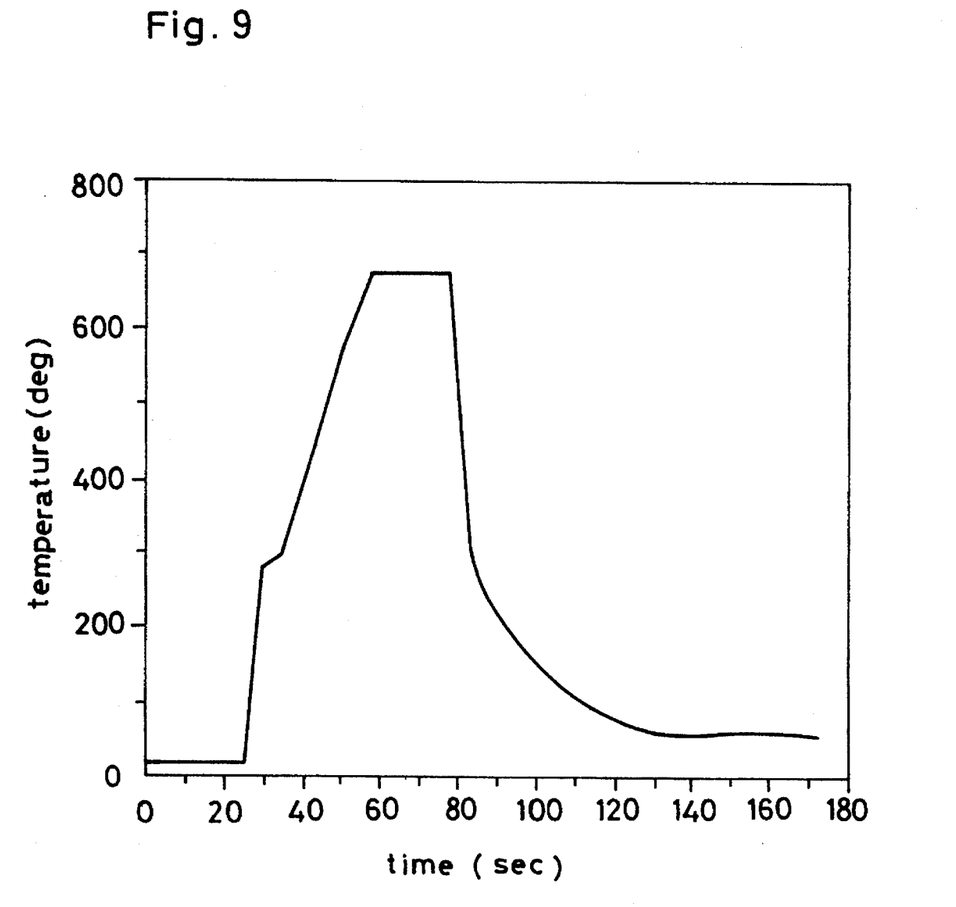
FIG. 9 is a graph indicating the change of the substrate temperature at RTP treatment.

At the deposition temperature of 500°–1000° C., the silicidation of a Ti film coincides with the formation of a Ti film, while at the deposition temperature of less than 500° C., an additional step of heating treatment is required. For said heating treatment, RTP apparatus can be used. Including RTP apparatus in a multi-chamber could prevent a Ti film from oxidization, contributing to forming a stable contact. Either the RTP treatment was carried out between forming a Ti film and a TiN film, or after forming a Ti film and a TiN film, good results could be obtained. It was confirmed that the reaction of silicidation proceeds at the thermal treatment temperature of more than 500° C. The optimal conditions of the RTP treatment are shown in Table 2 and the change of the Si substrate temperature at that time in FIG. 9.

[Table 2]
1. Evacuating to less than 1 m Torr,
2. Turning a heater on,
3. Staying at the heater power of 20% for 5 seconds,
4. Running the heater to 550° C. at 50° C./sec,
5. Running the heater to 675° C. at 10° C./sec,
6. Staying at 675° C. for 20 seconds,
7. Staying in heater idling for 3 seconds, and
8. Turning the heater off.

Although a native oxide film has been removed by wet scrubation before forming a Ti film in order to form a stable contact, the contact resistance in wafer varies widely and the repeatability is bad. The reason seems to be insufficient cleaning of the inside of a fine contact hole. Then, when a plasma cleaning was carried out with $CF_4$ gas before forming a Ti film, a stable contact having small variety and good yield could be achieved. The plasma cleaning can be carried out either in the chamber for forming a Ti film, or in the other chamber for cleaning apart from the chamber for forming a Ti film, but in the latter case, a Si substrate needs to be conveyed in a vacuum to the chamber for forming a Ti film. Once the substrate was exposed to the air, the stability of the contact became lower.

As a method for plasma cleaning, microwave plasma cleaning or ECR plasma cleaning made a good result (low resistant contact).

As a microwave plasma cleaning apparatus, SWP apparatus (surface wave produced plasma apparatus), used as an asher, was used, and the treatment was carried out for 2 minutes under the plasma conditions of $O_2 : CF_4$=368 : 52 sccm, pressure of 0.5 m Torr, microwave power of 1.5 kw and the substrate temperature of room temperature (K. Komachi and S. Kobayashi, J, Microwave Power and Electromagnetic Energy, vol.25, No.4, 1990), (K.Komachi et al. Extended Abstract of the Electrochemical Soc., Fall Meeting, Seattle, Oct. 14–19, 1990 pp.674–675).

Figure 10:
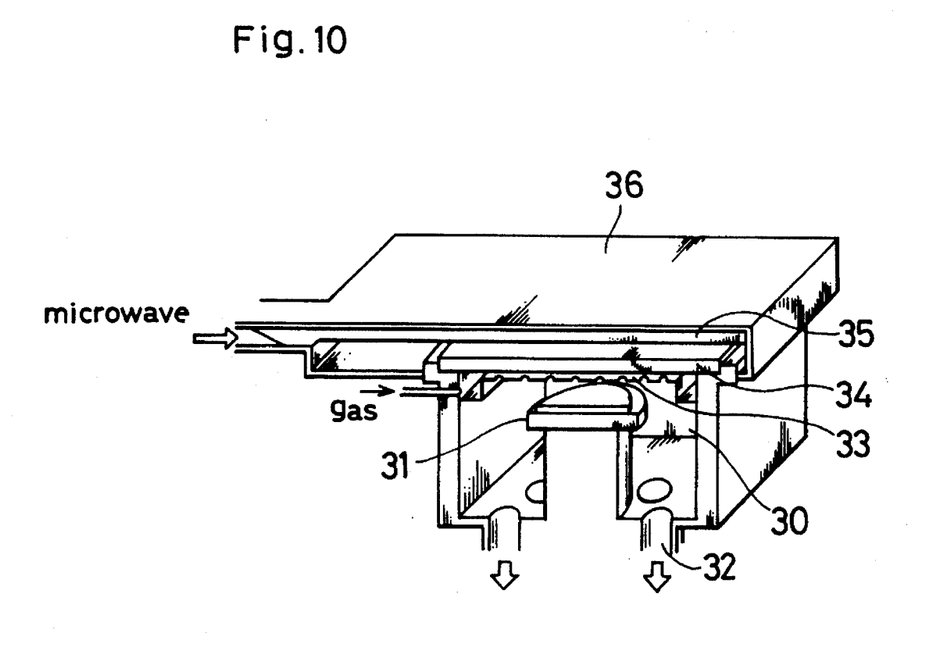
FIG. 10 is an oblique sectional view showing a microwave plasma cleaning apparatus.

The outline of the apparatus is shown in FIG. 10. Reference numeral 30 designates a cleaning chamber, in which a sample stage 31 is placed. At the bottom of the cleaning chamber 30, an exhaust port 32 is connected, and over the cleaning chamber 30, a plasma chamber 33 is formed. Over the plasma chamber 33, an almina plate 34, a Teflon sheet 35, an aluminum plate 36 etc. are placed.

Figure 12:
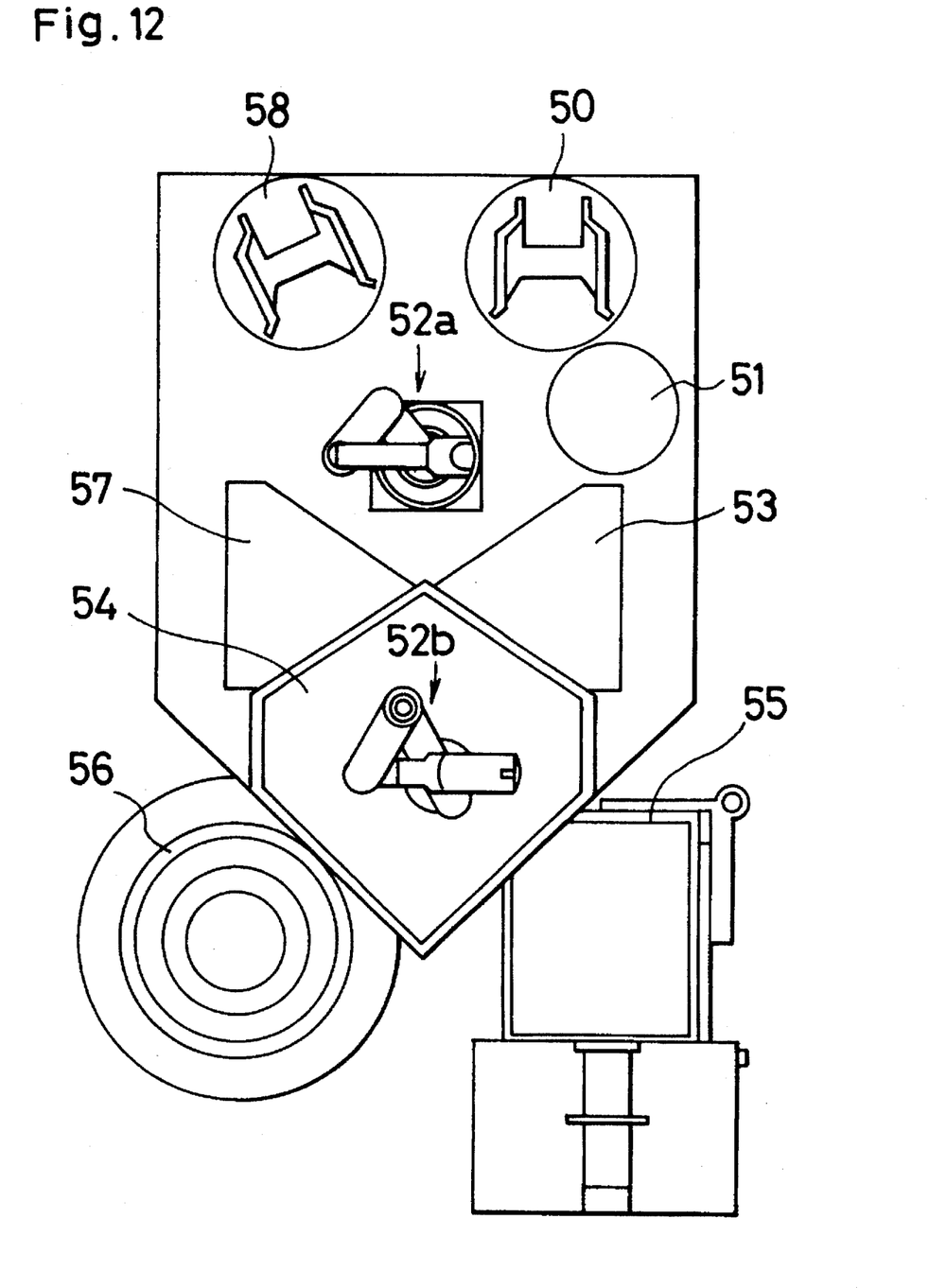
FIG. 12 is a ground plan showing a system having a chamber for plasma cleaning apart from a chamber for forming a Ti film and a TiN film.

FIG. 12 shows a composition (a ground plan) of a system having a chamber for the above-mentioned plasma cleaning apart from a chamber for forming a Ti film and a TiN film. With the exception that a cleaning chamber 55 takes the place of a plasma CVD chamber, the composition of the system can be considered to be much the same with the system in FIG. 11. Here, as the cleaning chamber 55, the SWP apparatus shown in FIG. 10 is used.

All of a transfer chamber 54, the cleaning chamber 55 and a ECR plasma CVD chamber 56 can be evacuated to vacuum. Therefore, a Si substrate cleaned in the cleaning chamber 55 is transferred through the transfer chamber 54 to the ECR plasma CVD chamber 56 without exposure to the air, and a Ti film and a TiN film are formed thereon.

As described above, forming a Ti rich TiN film in place of a Ti film is also effective.

Figure 7A:
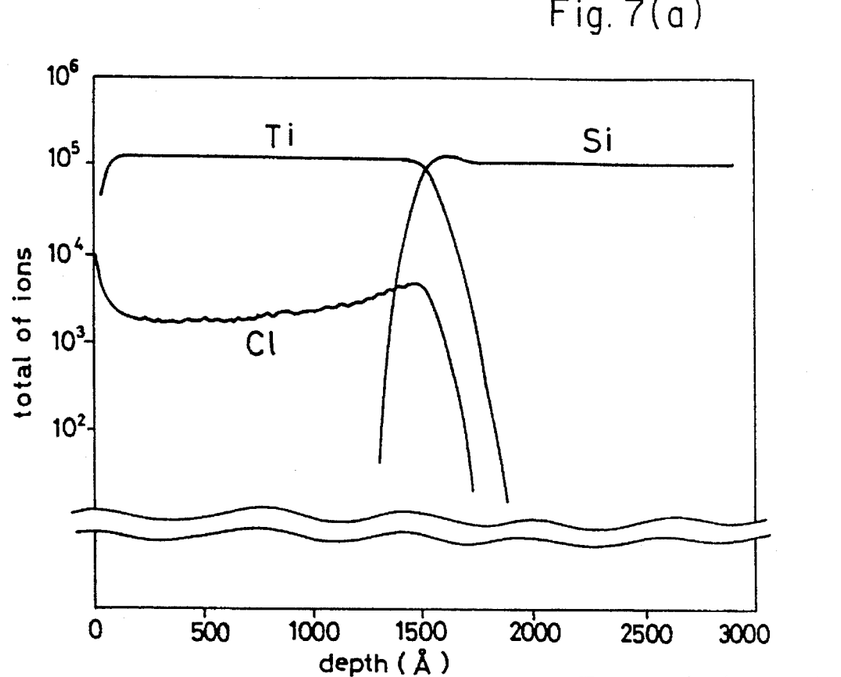
Figure 7B:
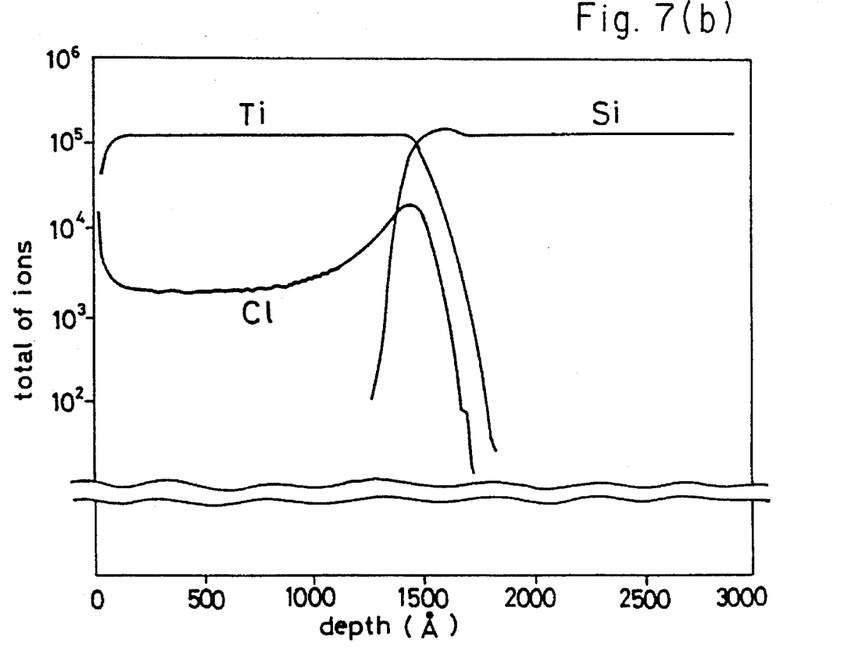

Here in after effects of irradiating the substrate 9 with $H_2$ and Ar plasma before introducing $TiCl_4$ gas when a Ti film and a TiN film formed in the apparatus shown in FIG. 2, are described. FIG. 7(a) shows the result of SIMS (secondary ion microscopy) analysis of the interface region of the substrate 9 on which a Ti film was formed by introducing $TiCl_4$ gas after irradiating the substrate 9 with $H_2$ and Ar plasma, while FIG. 7(b) shows that without irradiating the substrate 9 with $H_2$ and Ar plasma. In more detail, as for the substrate 9 in FIG. 7(a) $H_2$ gas of 50 sccm and Ar gas of 43 sccm were introduced into the plasma generation chamber 1 so as to generate plasma at microwave power of 2.8 kw, after that, $TiCl_4$ gas of 10 sccm, $H_2$ gas of 50 sccm and Ar gas of 43 sccm were supplied into the plasma generation chamber 1 and the reaction chamber 2 so as to form a Ti film. As obvious from this result, without the pretreatment by plasma, an adsorption layer of chlorine exists at the interface region of Si and Ti, and this adsorption layer of chlorine can be removed with the pretreatment by plasma.

Figure 8A:
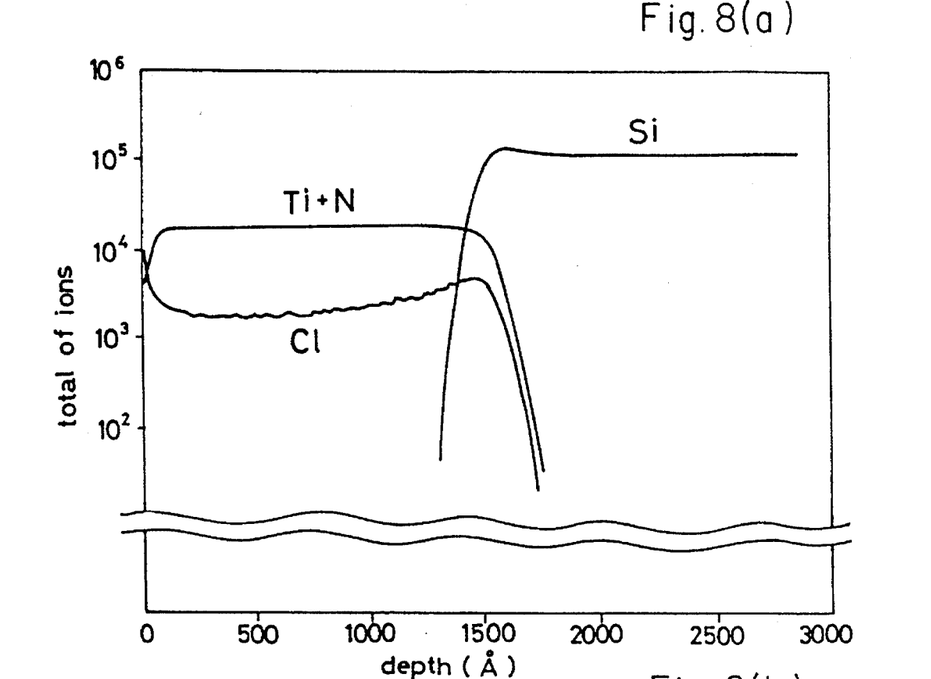
Figure 8B:
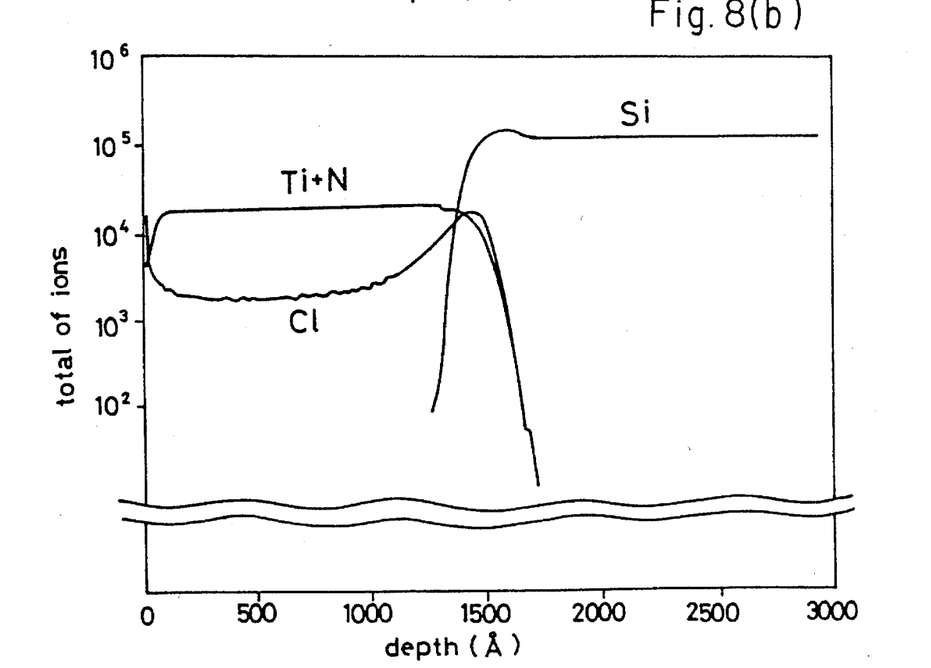

Concerning the pretreatment in the process of forming a TiN film, the results measured by SIMS are shown in FIGS. 8(a) and (b). The substrate 9 in FIG. 8(a) is the one on which a TiN film was formed by introducing $H_2$ gas of 50 sccm and Ar gas of 43 sccm into the plasma generation chamber to generate plasma at 2.8 kw microwave power as pretreatment, and supplying $TiCl_4$ gas of 10 sccm, $N_2$ gas of 15 sccm, $H_2$ gas of 50 sccm and Ar gas of 43 sccm. As known from this result, in the case without the pretreatment by plasma the substrate has an adsorption layer of chlorine at the interface region of Si and Ti, which can be removed by the pretreatment by plasma. In this measurement, the pretreatment and the deposition were carried out in the continuous plasma, while it was also effective that they were carried out by stages. The pretreatment by using only $H_2$ plasma was also effectual.

As obvious from the explanation above, by the method for forming a thin film and the systems for the same according to the present invention, it is possible to form a Ti or Ti rich film in a contact region at low temperature of about 500° C., and form a stable contact due to the combination with the process of forming a TiN film. In addition, including the processes of cleaning and thermal treatment can make yield and repeatability of forming a contact much better.

What is claimed is:

1. A method for forming a thin film of Ti on a substrate by a plasma CVD method using an electron cyclotron resonance (ECR) plasma system, comprising the steps of:
   (a) placing a substrate on a stage in a vacuum chamber of said ECR plasma system;
   (b) exhausting a gas in said vacuum chamber to reduce gas pressure;
   (c) supplying an $H_2$ gas and/or an Ar gas into said vacuum chamber;
   (d) generating an ECR plasma in said vacuum chamber by introducing a microwave and applying a magnetic flux density;
   (e) supplying a $TiCl_4$ gas into said vacuum chamber;
   (f) depositing a Ti film on said substrate;
   (g) stopping supplying said $TiCl_4$ gas into said vacuum chamber; and
   (h) stopping generating said ECR plasma after step (g).

2. A method of claim 1 wherein said $H_2$ gas and/or said Ar gas is supplied at a flow rate less than half of a flow rate of said $TiCl_4$ gas.

3. A method of claim 1 or 2 wherein a temperature of said substrate is less than 500° C.

4. A method for forming a multi-layer film comprising Ti and TiN on a substrate by a plasma CVD method using an ECR plasma system, comprising the steps of:

(a) placing a substrate on a stage in a vacuum chamber of said ECR plasma system;

(b) exhausting a gas in said vacuum chamber to reduce gas pressure;

(c) supplying an $H_2$ gas and/or an Ar gas into said vacuum chamber;

(d) generating an ECR plasma in said vacuum chamber by introducing a microwave and applying a magnetic flux density;

(e) supplying a $TiCl_4$ gas into said vacuum chamber;

(f) depositing a Ti film on said substrate;

(g) depositing a TiN film on the Ti deposited substrate by supplying a $N_2$ gas into said vacuum chamber;

(h) stopping supplying said $TiCl_4$ gas into said vacuum chamber; and (i) stopping generating said ECR plasma after step (h).

5. A method of claim 4 wherein said $N_2$ gas is supplied at a flow rate of less than half of a flow rate of said $TiCl_4$ gas.

6. A method of claim 4 wherein said $H_2$ gas and/or said Ar gas is supplied at a flow rate of less than half of a flow rate of said $TiCl_4$ gas.

7. A method of claim 4, 5 or 6 wherein a temperature of said substrate is less than 500° C.

8. A method for forming a multi-layer film comprising a Ti and a TiN on a substrate by a plasma CVD method using an ECR plasma system which comprises of vacuum chamber A and vacuum chamber B, the method comprising the steps of:

(a) exhausting a gas in two or more vacuum chambers to reduce gas pressure;

(b) supplying an $H_2$ gas and/or an Ar gas into said vacuum chamber A;

(c) supplying an $H_2$ gas and/or an Ar gas and $N_2$ gas into said vacuum chamber B;

(d) generating an ECR plasma in said vacuum chamber A and vacuum chamber B by introducing a microwave and applying a magnetic flux density;

(e) supplying a $TiCl_4$ gas into said vacuum chamber A and vacuum chamber B;

(f) placing a substrate on a stage in one of said vacuum chambers of said ECR plasma system;

(g) depositing a Ti film on said substrate in said chamber A;

(h) transferring the substrate from vacuum chamber A to vacuum chamber B after depositing said Ti film on said substrate in vacuum chamber A; and (i) depositing a TiN film on said substrate in said vacuum chamber B.

9. A method of claim 8 wherein said $N_2$ gas is supplied at a flow rate of less than half of a flow rate of said $TiCl_4$ gas.

10. A method of claim 8 wherein said $H_2$ gas and/or said Ar gas is supplied at a flow rate of less than half of a flow rate of said $TiCl_4$ gas.

11. A method of claim 8, 9 or 10 wherein a temperature of said substrate is less than 500° C.

12. A method of claim 8, 9 or 10 further comprising the step of applying a heat treatment before depositing a TiN film on said Ti deposited substrate in said vacuum chamber B.

* * * * *